(12) United States Patent
Matsunami et al.

(10) Patent No.: US 11,211,133 B2
(45) Date of Patent: Dec. 28, 2021

(54) SEMICONDUCTOR DEVICE WITH A DIAGNOSING SECTION THAT DIAGNOSES CORRECTION MEMORY AND SENSOR APPARATUS

(71) Applicant: FUJI ELECTRIC CO., LTD., Kanagawa (JP)

(72) Inventors: Kazuhiro Matsunami, Matsumoto (JP); Katsuhiro Shimazu, Goshogawara (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/882,531

(22) Filed: May 24, 2020

(65) Prior Publication Data

US 2021/0020257 A1    Jan. 21, 2021

(30) Foreign Application Priority Data

Jul. 17, 2019    (JP) .............................. JP2019-132077

(51) Int. Cl.
| | |
|---|---|
| *G11C 16/34* | (2006.01) |
| *G11C 16/28* | (2006.01) |
| *G11C 29/50* | (2006.01) |
| *G11C 29/52* | (2006.01) |
| *G11C 29/44* | (2006.01) |
| *G11C 29/04* | (2006.01) |

(52) U.S. Cl.
CPC .......... *G11C 16/3495* (2013.01); *G11C 16/28* (2013.01); *G11C 16/3404* (2013.01); *G11C 29/50004* (2013.01); *G11C 29/52* (2013.01); *G11C 2029/0409* (2013.01); *G11C 2029/4402* (2013.01); *G11C 2029/5004* (2013.01)

(58) Field of Classification Search
CPC .. G11C 16/3495; G11C 16/28; G01R 31/2884
See application file for complete search history.

(56) References Cited

U.S. PATENT DOCUMENTS

| | | | | |
|---|---|---|---|---|
| 6,201,742 | B1* | 3/2001 | Hirai ................... | G11C 16/3418 365/185.2 |
| 2008/0059038 | A1* | 3/2008 | Yoshida ............. | G05B 13/0265 701/99 |
| 2017/0356947 | A1* | 12/2017 | Kurimoto .............. | G01R 35/00 |
| 2020/0051650 | A1* | 2/2020 | Schatzberger ......... | G11C 16/08 |

FOREIGN PATENT DOCUMENTS

| | | |
|---|---|---|
| JP | 2001076496 A | 3/2001 |
| JP | 2003110029 A | 4/2003 |

\* cited by examiner

*Primary Examiner* — Mushfique Siddique

(57) ABSTRACT

To detect deterioration of a correction memory, provided is a semiconductor device including the correction memory that stores therein correction data for correcting a correction target; a correcting section that corrects a detection value of a sensor element, using correction data read from the correction memory; a diagnosing section that diagnoses the correction memory, using the correction data read from the correction memory; and a control section that controls reading conditions used when reading the correction data from the correction memory, wherein the control section causes a first reading condition, used when reading the correction data for correcting a correction target, to differ from a second reading condition, which is used when reading the correction data for the diagnosis.

11 Claims, 14 Drawing Sheets

SEMICONDUCTOR DEVICE WITH A DIAGNOSING SECTION THAT DIAGNOSES CORRECTION MEMORY AND SENSOR APPARATUS

The contents of the following Japanese patent application are incorporated herein by reference:
NO. 2019-132077 filed on Jul. 17, 2019.

BACKGROUND

1. Technical Field

The present invention relates to a semiconductor device and a sensor apparatus.

2. Related Art

Conventional technology is known for correcting variations in correction data stored in a nonvolatile memory in a semiconductor device, as shown in Patent Document 1, for example. Technology is also known for correcting detection values with correction data stored in a nonvolatile memory in a physical quantity sensor apparatus such as a pressure sensor or acceleration sensor. Furthermore, technology is known for preventing an incorrect data reading operation in a nonvolatile memory, as shown in Patent Document 2, for example.

Patent Document 1: Japanese Patent Application Publication No. 2003-110029
Patent Document 2: Japanese Patent Application Publication No. 2001-76496

SUMMARY

In a nonvolatile memory, it is preferable to be able to detect an increase in the possibility of incorrect data reading before this incorrect data reading occurs.

To solve the above problem, according to one aspect of the present invention, provided is a semiconductor device. The semiconductor device may comprise a correction memory that stores therein correction data for correcting a detection value of a sensor element. The semiconductor device may comprise a correcting section that corrects the detection value of the sensor element, using correction data read from the correction memory. The semiconductor device may comprise a diagnosing section that diagnoses the correction memory, using the correction data read from the correction memory. The semiconductor device may comprise a control section that controls reading conditions used when reading the correction data from the correction memory. The control section may cause a first reading condition, used when the correction calculating section reads the correction data, to differ from a second reading condition, which is used when the diagnosing section reads the correction data.

The reading conditions may be conditions that cause a change in how easily an error occurs in the read correction data, when the conditions are changed. The diagnosing section may diagnose the correction memory by comparing the correction data read according to the second reading condition to reference data.

The reference data may be correction data read according to the first reading condition.

The control section may set the second reading condition to cause an error to occur more easily in the read correction data, compared to the first reading condition.

The correction memory may include a control gate to which a gate voltage is applied. The correction memory may include an output terminal having an output value that changes according to whether or not the gate voltage applied to the control gate is greater than or equal to a threshold voltage. The correction memory may include a floating gate that accumulates charge corresponding to a value of the correction data, and changes the threshold voltage according to the accumulated charge. The control section may change the gate voltage applied to the control gate for reading the correction data, between the first reading condition and the second reading condition.

The correction memory may include a first cell that increases the threshold voltage when the charge accumulated in the floating gate increases. The diagnosing section may set a gate voltage applied to the first cell under the second reading condition to be a higher voltage than a gate voltage applied to the first cell under the first reading condition.

The correction memory may include a second cell that decreases the threshold voltage when the charge accumulated in the floating gate increases. The diagnosing section may set a gate voltage applied to the second cell under the second reading condition to be a lower voltage than a gate voltage applied to the second cell under the first reading condition.

The correction memory may include a plurality of twin cells, which each include a first cell and a second cell. The diagnosing section may diagnose a plurality of the first cells by reading the correction data from a plurality of the first cells. The diagnosing section may diagnose a plurality of the second cells by reading the correction data from a plurality of the second cells.

The correction memory may include a current source that is connected to the output terminal and defines a threshold current. The control section may change the threshold current, between the first reading condition and the second reading condition.

The diagnosing section may set a threshold current of the first cell under the second reading condition to be a smaller current than a threshold current of the first cell under the first reading condition.

The diagnosing section may set a threshold current of the second cell under the second reading condition to be a larger current than a threshold current of the second cell under the first reading condition.

The diagnosing section may detect the reading condition that causes an error in the correction data, and diagnose the correction memory based on change over time of the detected reading condition.

According to a second aspect of the present invention, provided is a sensor apparatus that includes the semiconductor device according to the first aspect and a sensor element. The correction target of the semiconductor device may be a detection value of the sensor element.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to solutions provided by aspects of the invention.

The following describes an example of correction of a detection value of a sensor element, but the present invention is not limited to correcting a detection value of a sensor element. For example, the present invention can also be used to diagnose a nonvolatile memory that stores correction data for variations in characteristics of a switching element in the semiconductor device described in Patent Document 1.

Figure 1:
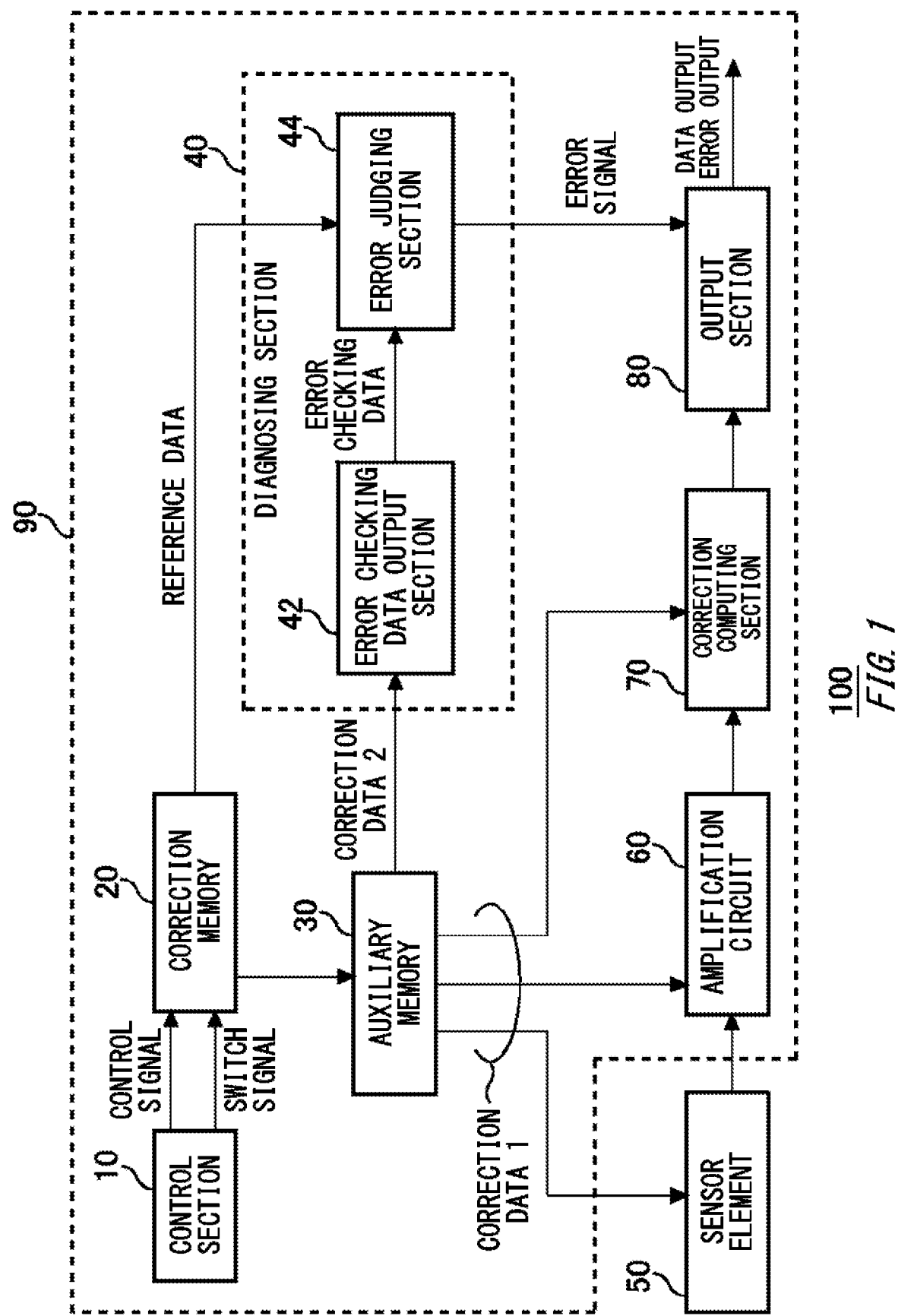
FIG. 1 is a block diagram of an example of a sensor apparatus 100 according to one embodiment of the present invention.

FIG. 1 is a block diagram of an example of a sensor apparatus 100 according to one embodiment of the present invention. As an example, the sensor apparatus 100 is used in various apparatuses used in fields such as automobiles, medicine, manufacturing, or the like. The sensor apparatus 100 may include a sensor element 50 that detects a prescribed physical quantity, such as a pressure sensor or an acceleration sensor, or may be an apparatus that processes a detection value of an external sensor element 50. The sensor element 50 is an element formed in a semiconductor substrate, for example.

The sensor apparatus 100 of the present example includes a control section 10, a correction memory 20, a diagnosing section 40, a sensor element 50, and a correction calculating section 70 (correcting section). The sensor apparatus 100 may further include at least a portion of an auxiliary memory 30, an amplification circuit 60, and an output section 80. Furthermore, the sensor apparatus 100 may be formed by a sensor element 50 formed on a semiconductor substrate and a semiconductor device 90 formed on the same semiconductor substrate as a structure that is not the sensor element 50.

The correction memory 20 stores correction data for correcting a detection value (correction target) of the sensor element 50. The correction data is data used to adjust the sensitivity, adjust a temperature characteristic, or the like of the sensor element 50. The correction data may be input in advance to the correction memory 20 when the sensor apparatus 100 is shipped or implemented, or at some other timing. The correction data may be generated based on an operational result of causing the sensor apparatus 100 to operate in a prescribed environment.

The correction memory 20 is a nonvolatile memory, for example. The nonvolatile memory is a flash memory, an EPROM, or an EEPROM, for example. The correction memory 20 stores digital data by saving a prescribed physical quantity. The prescribed physical quantity is the quantity of charge accumulated in a floating gate, for example. The correction memory 20 may output binary data corresponding to whether or not the saved physical quantity is greater than or equal to a prescribed threshold value.

The auxiliary memory 30 temporarily stores the correction data read from the correction memory 20. The auxiliary memory 30 is a register, for example. The amplification circuit 60 amplifies and outputs a detection signal that is output by the sensor element 50. The detection signal is a signal indicating a detection value that has been detected by the sensor element 50. In this Specification, there are cases where the description is made using a detection signal instead of the detection value of the sensor element 50. The correction calculating section 70 corrects the detection signal output by the amplification circuit 60 using the correction data. In this Specification, the correction data for correcting the detection signal of the sensor element 50 is correction data 1. Furthermore, a time during which the detection signal of the sensor element 50 is corrected by reading the correction data 1 may be referred to as the normal time. The output section 80 outputs digital data corresponding to the detection signal corrected by the correction calculating section 70, as data output indicating the detection value of the sensor element 50. The correction data 1 may also be input to at least one of the sensor element 50 and the amplification circuit 60. At least a portion of the correction process using the correction data 1 may be performed by the sensor element 50 or the amplification circuit 60.

There are cases where the physical quantity saved by the correction memory 20 changes over time, compared to immediately after the data is written. For example, the charge accumulated in a floating gate can decrease due to natural deterioration caused by discharge or the like, leakage due to an oxide film defect or the like, extraction caused by external noise, or the like.

When the correction data stored in the correction memory 20 fluctuates, the characteristics of the sensor apparatus 100 fluctuate. The diagnosing section 40 checks whether the possibility of an error occurring in the future in the data (i.e. the physical quantity) stored by the correction memory 20 has increased. When a leak occurs due to an oxide film defect or the like or when extraction occurs due to external noise, the value of a specified bit of the correction memory 20 changes. In such a case, it is possible to detect this change using a majority circuit. When using a majority circuit, each bit of the correction memory 20 includes a plurality of cells. The majority circuit outputs whichever logic value is output by more cells, among the logic values output by these cells, as the logic value for this bit. In this way, even when the values of a small number of cells have changed, an error does not occur in the logic value of this bit. Furthermore, by detecting a change in the value of each cell, it is possible to detect in advance that the possibility of an error occurring in the logic value of this bit in the future has increased.

However, in the method described above, when the values of a large number of cells have changed simultaneously due to natural deterioration or the like, it is difficult to detect in advance that the possibility of an error occurring in the data of the correction memory 20 has increased. Since natural deterioration occurs in the same manner in each of the cells, the physical quantities of the cells fluctuate in the same manner. Therefore, when natural deterioration continues, it becomes easier for errors to occur simultaneously in a large number of cells. An error occurs in the logic value of this bit when the logic values of a large number of cells in the majority circuit change. On the other hand, when the natural deterioration continues, the logic values of a large number of cells change almost at the same time. Therefore, with the method that uses a majority circuit or the like, it is impossible to detect in advance that the possibility of an error occurring has increased, and errors occur in the logic values of these bits.

The sensor apparatus 100 of the present example detects that the possibility of an error occurring in the data of the correction memory 20 has increased, even in a case where the physical quantities of a large number of cells have deteriorated in the same manner due to natural deterioration or the like. The control section 10 controls a condition for reading, when reading the correction data from the correction memory 20. This reading condition is a condition that, when changed, causes a change in how easily an error occurs in the read correction data. For example, the correction memory 20 includes a switching element that has a control gate and a floating gate corresponding to each bit. In this case, the reading condition may be a voltage value of a gate voltage applied to the control gate or a value of the current flowing through the switching element. In this Specification, there are cases where this current is referred to as a threshold current.

The diagnosing section 40 of the present example diagnoses the correction memory 20 based on correction data 2 that is read from the correction memory 20. In this Specification, a time during which the diagnosis is performed by reading the correction data 2 may be referred to as the diagnostic time.

The control section 10 causes a first reading condition, which is used when the correction calculating section 70 reads the correction data 1, to differ from a second reading condition, which is used when the diagnosing section 40 reads the correction data 2. In the correction memory 20 of the present example, the logic value of each bit is read by applying a prescribed gate voltage to the control gate thereof. The control section 10 may cause the gate voltage to differ or the threshold current described above to differ, between the first reading condition and the second reading condition.

The control section 10 of the present example sets the second reading condition in a manner to make it easier for an error to occur in the correction data read from the correction memory 20, compared to the first reading condition. Essentially, the conditions are set such that, when the physical quantities saved by the correction memory 20 gradually decrease (or increase) due to natural deterioration and the correction data is read periodically using the first reading condition and the second reading condition, an error occurs in the correction data read using the second reading condition earlier than in the correction data read using the first reading condition.

When an error occurs in the correction data 2 read using the second reading condition, it is understood that the physical quantity saved in the correction memory 20 has changed by at least a certain quantity due to natural deterioration or the like. In this way, the diagnosing section 40 can detect that the possibility of an error occurring in the correction data 1 has increased, before an error actually occurs in the correction data 1.

The diagnosing section 40 of the present example includes an error checking data output section 42 and an error judging section 44. The error checking data output section 42 outputs error checking data corresponding to the correction data 2. The error checking data may be a value obtained by performing a prescribed computation on the correction data 2. For example, the error checking data includes a parity code, cyclic code, checksum, or the like of the correction data 2. The error checking data may also include the correction data 2 itself.

The error judging section 44 judges whether an error has occurred in the correction data 2, based on the error checking data output by the error checking data output section 42. The error judging section 44 may compare the error checking data to reference data. The reference data may be stored in the correction memory 20. The reference data may include a parity code, cyclic code, checksum, or the like of the correction data stored in the correction memory 20.

When an error is detected by the error judging section 44, the output section 80 generates error output indicating this fact. In this way, a user or the like of the sensor apparatus 100 can be notified that there is a high possibility of an error occurring in the correction data 1.

Figure 2:
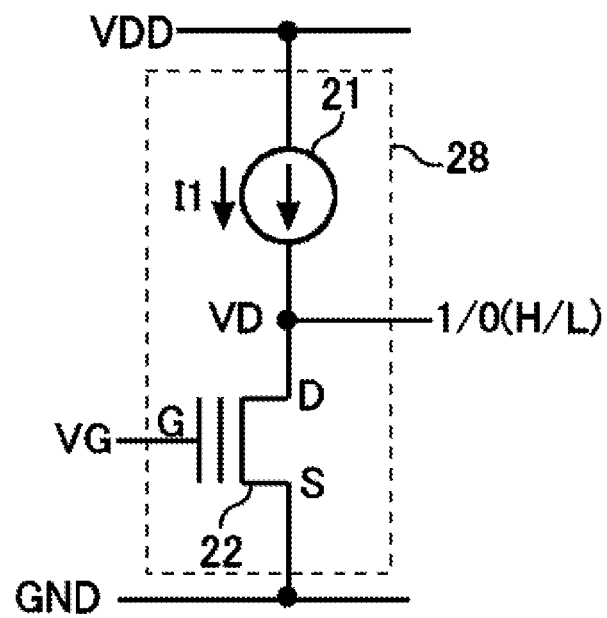
FIG. 2 is a diagram for describing an overview of the correction memory 20.

FIG. 2 is a diagram for describing an overview of the correction memory 20. The correction memory 20 includes one or more cells 28. One cell 28 may store one bit of data, or a plurality of cells 28 may store one bit of data.

The cell 28 includes a current source 21 and a switching element 22. The current source 21 is connected to a drain terminal D of the switching element 22, and defines the threshold current I1 of the cell 28. The switching element 22 of the present example is a MOSFET that includes a floating gate. The drain terminal D of the switching element 22 is connected to a high-potential line VDD via the current source 21, and the source terminal S is connected to a low-potential line GND. The bit of data is read according to the voltage of the drain terminal D when a prescribed gate voltage VG is applied to the gate terminal G of the switching element 22. In other words, the drain terminal D functions as an output terminal of the cell 28.

Figure 3:
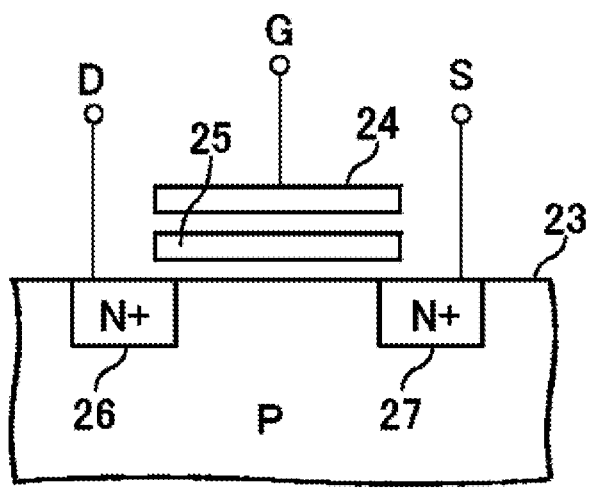
FIG. 3 is a cross-sectional view of an example of the switching element 22.

FIG. 3 is a cross-sectional view of an example of the switching element 22. The switching element 22 of the present example includes a P-type semiconductor substrate 23, an N-type drain region 26, and N-type source region 27, a floating gate 25, and a control gate 24. The drain region 26 and the source region 27 are arranged distanced from each other on the top surface of the semiconductor substrate 23. The P-type region between the drain region 26 and the source region 27 functions as a channel of the MOSFET.

The floating gate 25 and the control gate 24 are arranged above the channel. The semiconductor substrate 23, the floating gate 25, and the control gate 24 may each be insulated by an insulating film. The gate voltage is applied to the control gate 24.

A charge corresponding to a value of the data stored in the cell 28 is accumulated in the floating gate 25. A gate voltage that causes the switching element 22 to transition from the OFF state to the ON state and causes the current flowing through the switching element 22 to become greater than or equal to the prescribed threshold current I1 is referred to as the threshold voltage of the cell 28. This threshold voltage fluctuates according to the quantity of charge accumulated in the floating gate 25. The greater the quantity of charge accumulated in the floating gate 25 increases, the larger the threshold voltage of the present example becomes. That is, the floating gate 25 accumulates a charge corresponding to a value of each bit of correction data, and causes the threshold voltage of the cell 28 to fluctuate according to the accumulated charge.

Figure 4:
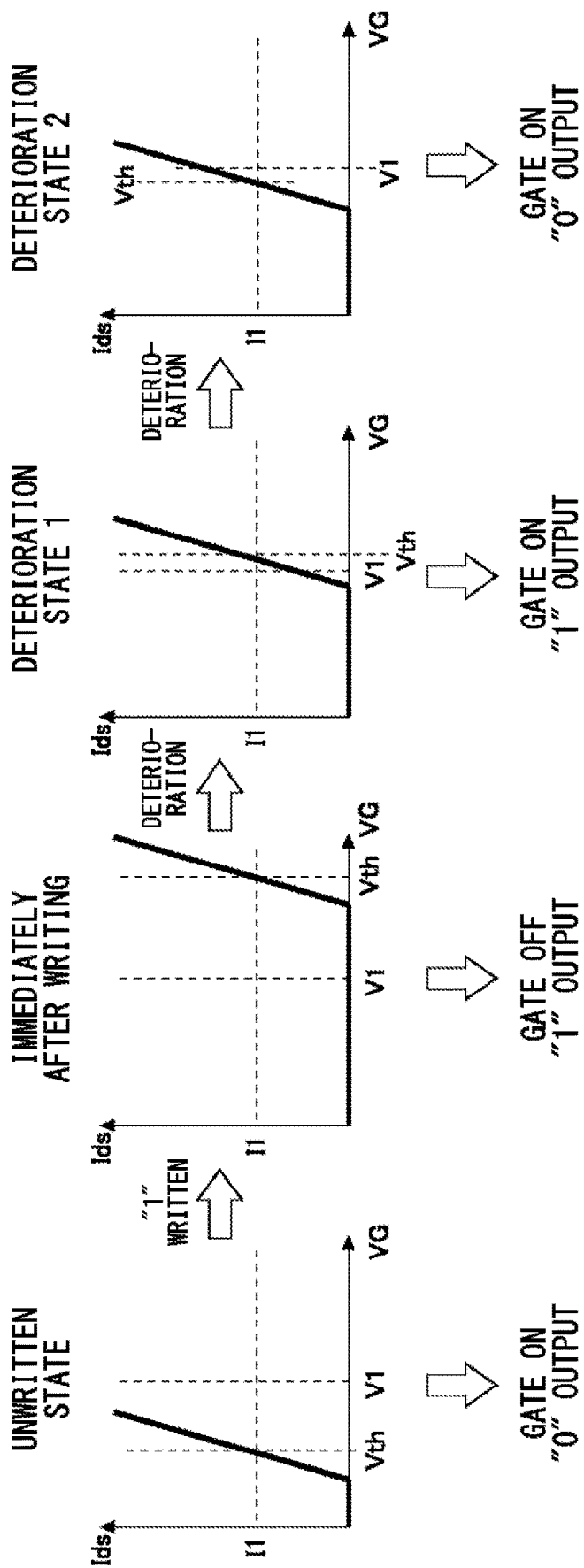
FIG. 4 shows an example of change over time of the IV characteristic in the switching element 22.

FIG. 4 shows an example of change over time of the IV characteristic in the switching element 22. In FIG. 4, the horizontal axis of each graph indicates the gate voltage VG of the switching element 22, and the vertical axis of each graph indicates the source-drain current Ids. In the present example, the gate voltage for reading data is V1, and the threshold current is I1. The output value of the drain terminal D changes according to whether or not the gate voltage applied to the control gate 24 of the switching element 22 is greater than or equal to the threshold voltage.

In an unwritten state where charge is not accumulated in the floating gate 25, the threshold voltage Vth becomes smaller than the gate voltage V1 used for data reading. Accordingly, when the gate voltage V1 is applied to the switching element 22, the switching element 22 enters the ON state. In this case, the bit value read from the cell 28 via the drain terminal D is 0 (or L).

Next, in the present example, a charge quantity greater than or equal to a prescribed quantity is accumulated in the floating gate 25 in order to write a bit value of 1 to the cell 28. Immediately after the writing, the threshold voltage Vth of the cell 28 becomes larger than the gate voltage V1 for data reading. Immediately after the writing, when the gate voltage V1 is applied to the switching element 22, the switching element 22 enters the OFF state, and the drain voltage VD becomes a voltage corresponding to the high potential VDD. Accordingly, the bit value read from the cell 28 is 1 (or H).

In this way, by accumulating the charge quantity corresponding to the bit value in the floating gate 25, it is possible to store the bit value in the cell 28. However, when time has passed from when the data writing was performed, the charge quantity accumulated in the floating gate 25 decreases due to natural deterioration or the like. Therefore, the threshold voltage Vth of the cell 28 fluctuates as shown in the deterioration states 1 and 2. In the deterioration state 1, when the gate voltage V1 is applied to the switching element 22, current starts to flow through the switching element 22. However, the current flowing through the switching element 22 is smaller than the threshold current I1, and the bit value read from the cell 28 is 1 (or H). Therefore, in the deterioration state 1, the deterioration of the data storage proceeds, but no errors occur in the data reading.

As shown in the deterioration state 2, when the charge of the floating gate 25 further decreases, the threshold voltage Vth becomes smaller than the gate voltage V1. In the deterioration state 2, when the gate voltage V1 is applied to the switching element 22, the current flowing through the switching element 22 becomes larger than the threshold current I1, and the bit value read from the cell 28 becomes 0 (or L). In other words, an error occurs in the bit value read from the cell 28.

In a state before the deterioration state 2, e.g. the deterioration state 1 or the like, the sensor apparatus 100 of the present example detects that deterioration has occurred in the data storage. In this way, a user or the like can replace or the like the sensor apparatus 100, before reaching the deterioration state 2. Therefore, the sensor apparatus 100 is prevented from outputting incorrect data. In a case where an engine or the like is controlled according to the data output of the sensor apparatus 100, incorrect operation of the engine or the like can be prevented.

Figure 5:
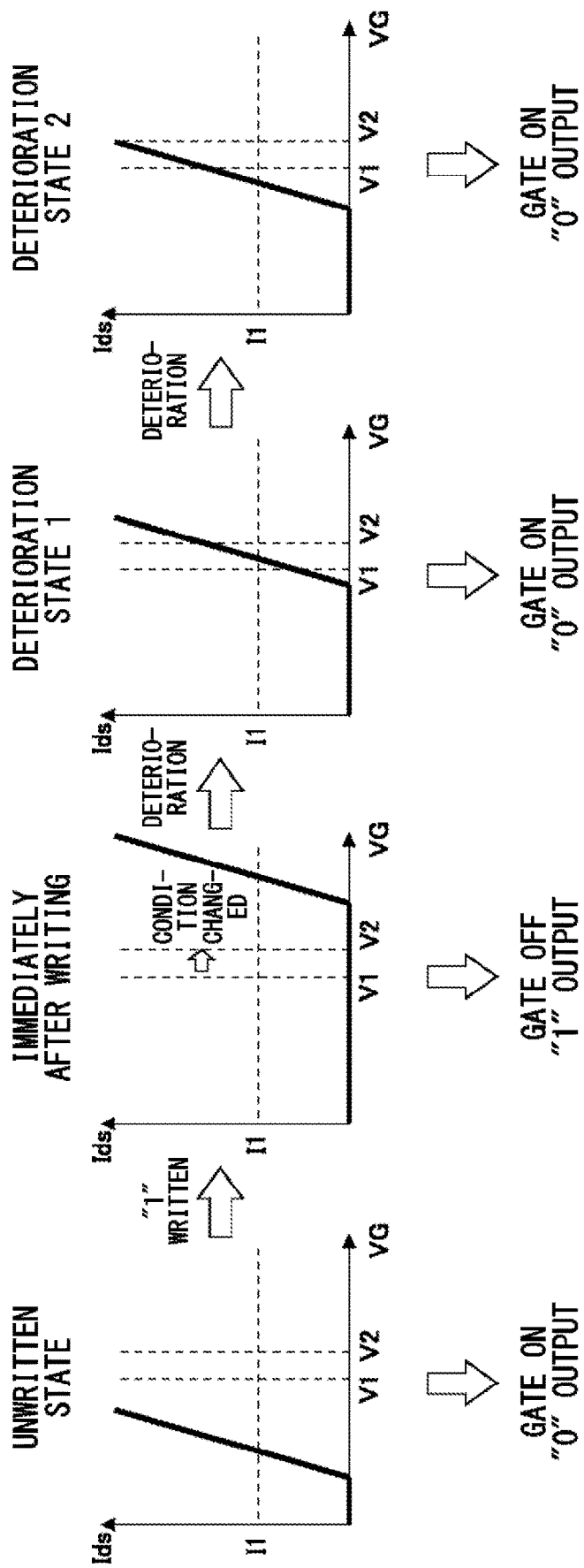
FIG. 5 is a diagram for describing an example of an operation of the sensor apparatus 100.

FIG. 5 is a diagram for describing an example of an operation of the sensor apparatus 100. The switching element 22 of the present example has the same characteristics as the example shown in FIG. 4. The sensor apparatus 100 changes the reading conditions for the correction data, between a normal time and a diagnostic time. The sensor apparatus 100 of the present example reads the correction data 1 using the gate voltage V1 during the normal time, and reads the correction data 2 using the gate voltage V2 during the diagnostic time.

As described above, the gate voltage V2 is a gate voltage that makes it easier for an error to occur in the correction data than the gate voltage V1. For example, as shown in FIGS. 4 and 5, when the threshold voltage Vth of the cell 28 increases due to an increase in the charge accumulated in the floating gate 25, the gate voltage V2 is a higher voltage than the gate voltage V1. The gate voltage V2 may be greater than or equal to 110%, 120%, or 130% of the gate voltage V1. Furthermore, the gate voltage V2 may be less than or equal to 150% of the gate voltage V1.

In the switching element 22 shown in FIG. 3, the semiconductor substrate 23 may be N-type and the drain region 26 and source region 27 may be P-type. In such a case, when the charge accumulated in the floating gate 25 increases, the threshold voltage Vth of the cell 28 decreases. In this example, the gate voltage V2 is a lower voltage than the gate voltage V1. The gate voltage V2 may be less than or equal to 90%, 80%, or 70% of the gate voltage V1. Furthermore, the gate voltage V2 may be greater than or equal to 50% of the gate voltage V1.

In the example shown in FIG. 5, by using the gate voltage V2 during the diagnostic time, deterioration of the charge quantity of the floating gate 25 can be detected before reaching the state (deterioration state 2) in which an error occurs in the value of the correction data 1 during the normal time. For example, when the gate voltage V2 is applied to the switching element 22 in the deterioration state 1, a current that is larger than the threshold current I1 flows through the switching element 22. As a result, the bit value read from the cell 28 becomes 0, and an error can be detected.

Figure 6:
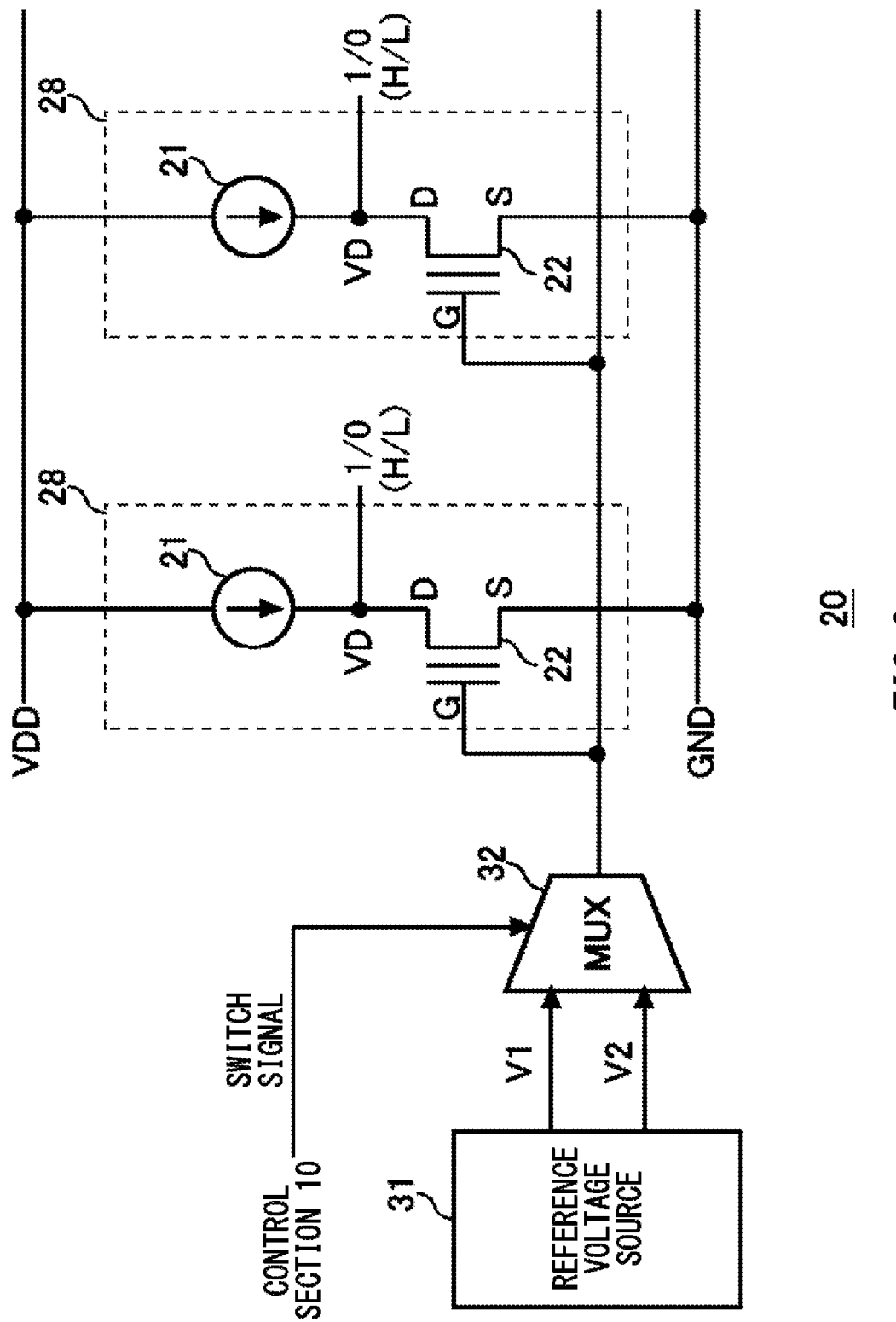
FIG. 6 shows an example of a configuration of the correction memory 20.

FIG. 6 shows an example of a configuration of the correction memory 20. The correction memory 20 of the present example switches the gate voltage applied to the cell 28, between the normal time and the diagnostic time, as shown in FIG. 5. The correction memory 20 includes one or more cells 28, a reference voltage source 31, and a selecting section 32. The reference voltage source 31 generates the gate voltage V1 to be used during the normal time and the gate voltage V2 to be used during the diagnostic time. According to a switching signal input from the control section 10, the selecting section 32 selects one of the gate voltage V1 and the gate voltage V2 and applies this voltage to each cell 28. According to such a configuration, an operation such as shown in FIG. 5 can be performed.

Figure 7:
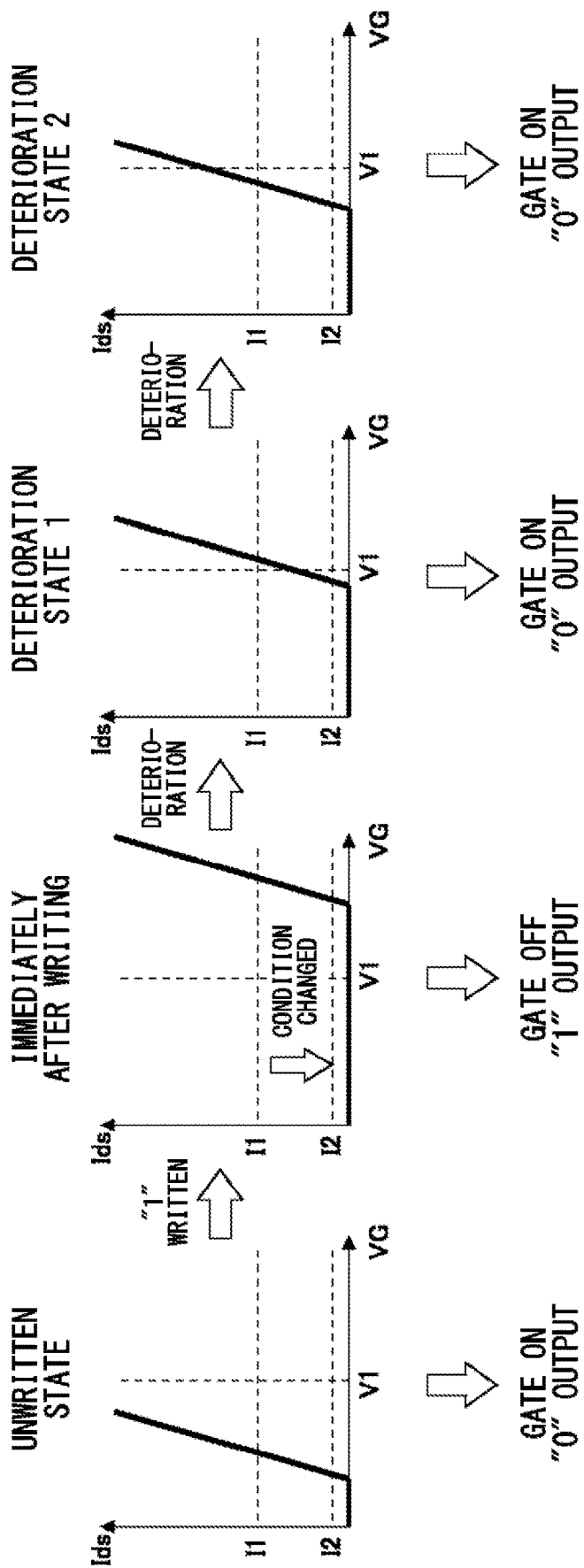
FIG. 7 is a diagram for describing an example of another operation of the sensor apparatus 100.

FIG. 7 is a diagram for describing an example of another operation of the sensor apparatus 100. The switching element 22 of the present example has the same characteristics as the example shown in FIG. 4. The sensor apparatus 100 of the present example reads the correction data 1 using the threshold current I1 during the normal time, and reads the correction data 2 using the threshold current I2 during the diagnostic time. In the present example, the gate voltage for the data reading is V1 during the normal time and the diagnostic time.

As described above, the threshold current I2 is a threshold current that makes it easier for an error to occur in the correction data than the threshold current I1. For example, as shown in FIGS. 4 and 7, when the charge accumulated in the floating gate 25 increases and causes the threshold voltage Vth of the cell 28 to increase, the threshold current I2 is a smaller current than the threshold current I1. The threshold current I2 may be less than or equal to 90%, 80%, or 70% of the threshold current I1. Furthermore, the threshold current I2 may be greater than or equal to 50% of the threshold current I1.

In the example shown in FIG. 7, by using the threshold current I2 during the diagnostic time, the deterioration of the charge quantity of the floating gate 25 can be detected before reaching a state (deterioration state 2) in which an error occurs in the value of the correction data. For example, when the gate voltage V1 is applied to the switching element 22 in the deterioration state 1, a current larger than the threshold current I2 flows through the switching element 22. As a result, the bit value read from the cell 28 becomes 0, and an error can be detected.

Figure 8:
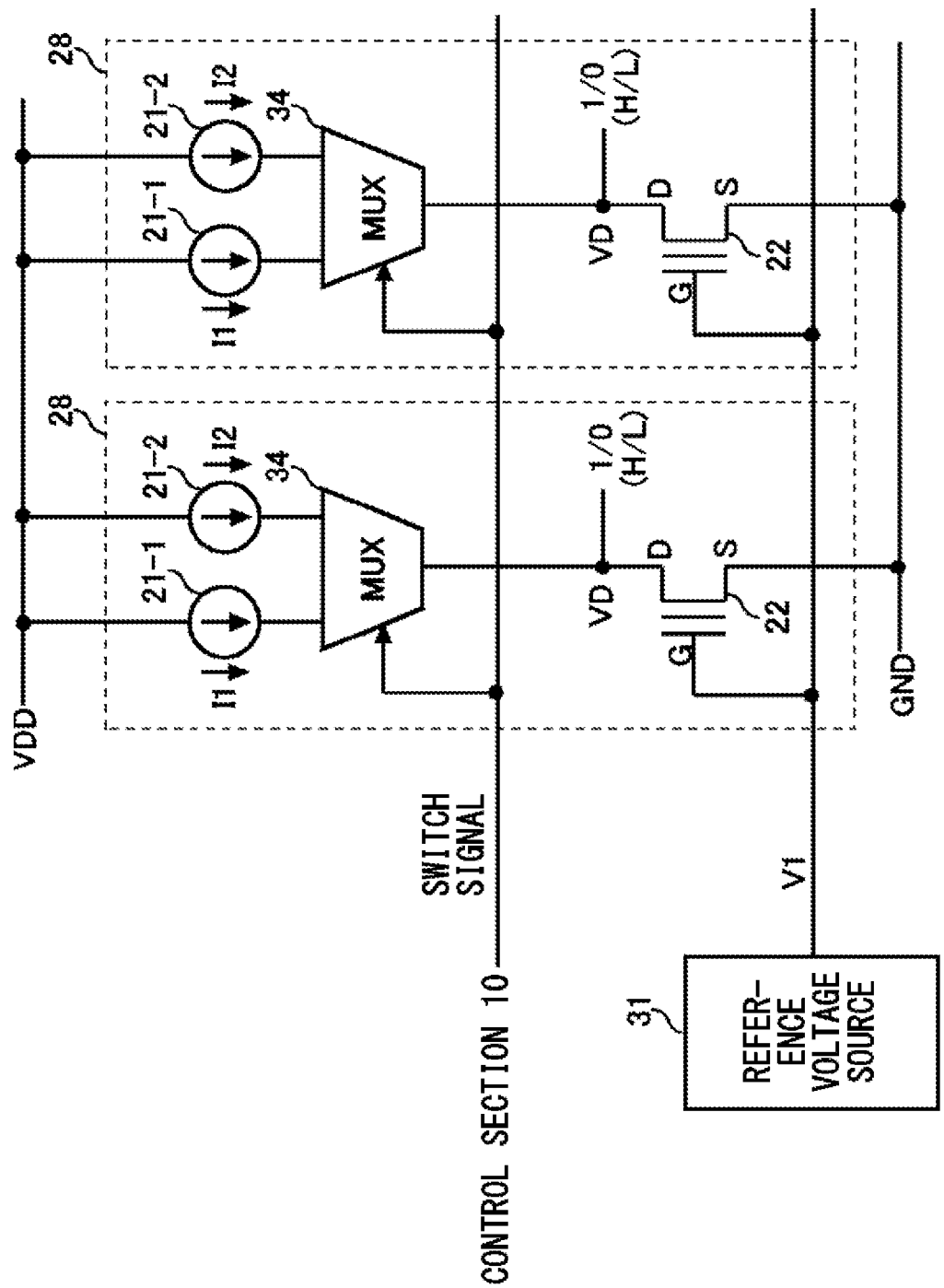
FIG. 8 shows another example of a configuration of the correction memory 20.

FIG. 8 shows another example of a configuration of the correction memory 20. The correction memory 20 of the present example switches the threshold current applied to the cell 28, between the normal time and the diagnostic time, as shown in FIG. 7. The correction memory 20 includes one or more cells 28, and the reference voltage source 31. The reference voltage source 31 applies the gate voltage V1 to each cell 28.

Each cell 28 includes a current source 21-1, a current source 21-2, and a selecting section 34, in addition to the configuration described in FIG. 2. The current source 21-1 generates the threshold current I1 to be used during the normal time, and the current source 21-2 generates the threshold current I2 to be used during the diagnostic time. The selecting section 34 selects one of the current source 21-1 and the current source 21-2, according to a switch signal input from the control section 10, and connects this current source to the drain terminal D of the switching element 22. According to such a configuration, an operation such as shown in FIG. 7 can be performed.

Figure 9:
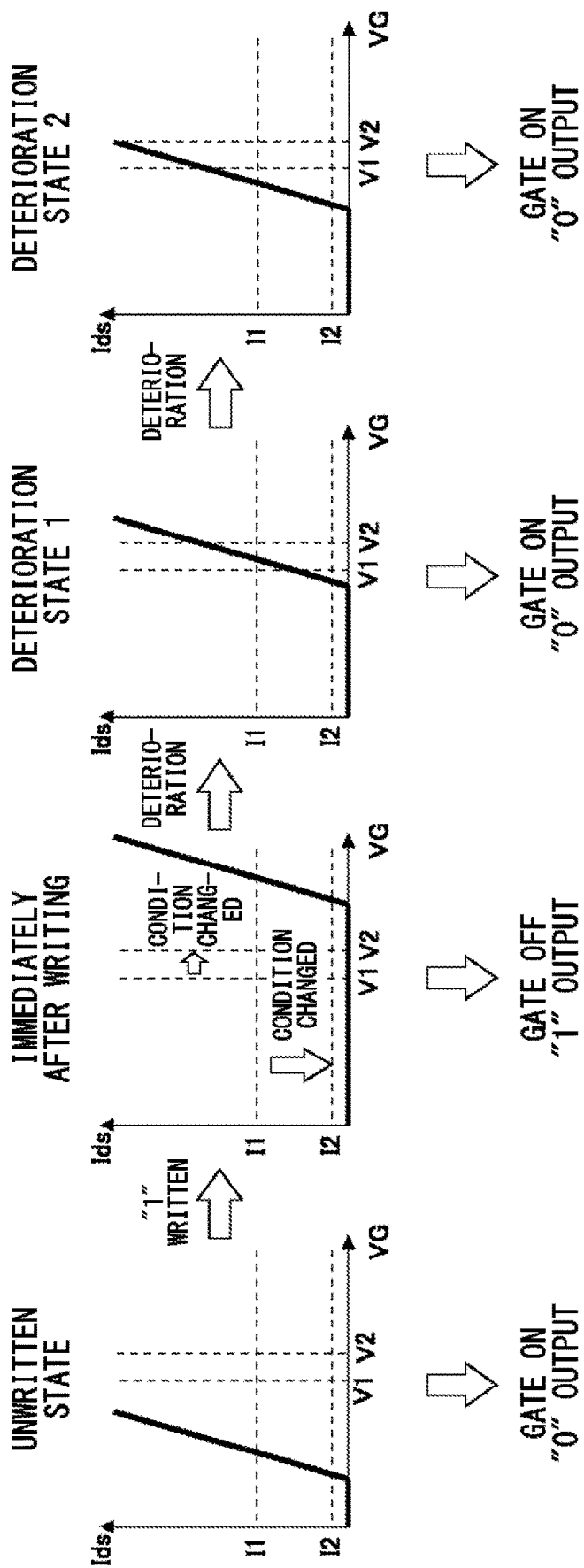
FIG. 9 is a diagram for describing an example of another operation of the sensor apparatus 100.

FIG. 9 is a diagram for describing an example of another operation of the sensor apparatus 100. The switching element 22 of the present embodiment has the same characteristics as the example shown in FIG. 4. The sensor apparatus 100 of the present example reads the correction data 1 using the gate voltage V1 and the threshold current I1 during the normal time, and reads the correction data 2 using the gate voltage V2 and the threshold current I2 during the diagnostic time. According to such control, the deterioration of the charge quantity of the floating gate 25 can be detected even earlier. The correction memory 20 may include the reference voltage source 31 and the selecting section 32 shown in FIG. 6. Furthermore, each cell 28 may include the current source 21-1, the current source 21-2, and the selecting section 34 shown in FIG. 8.

Figure 10:
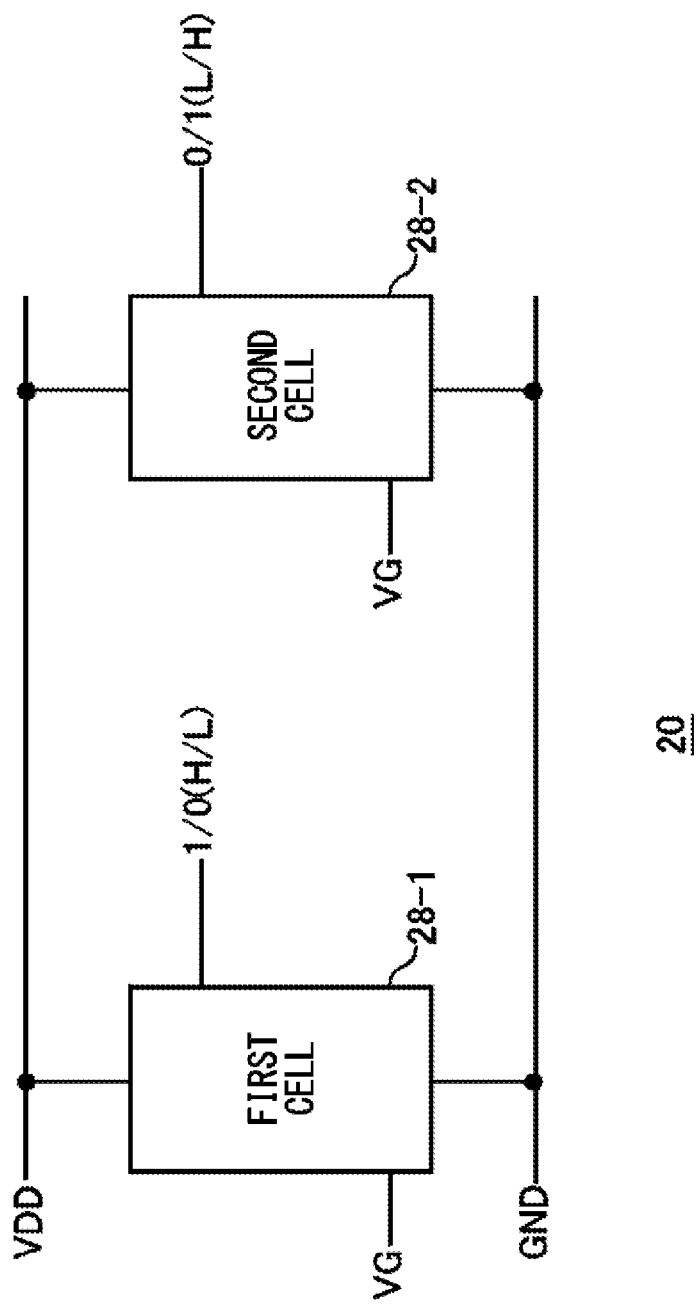
FIG. 10 shows an example of another configuration of the correction memory 20.

FIG. 10 shows an example of another configuration of the correction memory 20. The correction memory 20 of the present example includes a first cell 28-1 and a second cell 28-2 for each single bit. One set of a first cell 28-1 and a second cell 28-2 may be referred to as a twin cell. The first cell 28-1 and the second cell 28-2 are each the same as the cells 28 described in FIGS. 2 and 3. In other words, the threshold voltage Vth increases when the charge accumulated in the floating gate 25 increases, and the threshold voltage Vth decreases when the charge accumulated in the floating gate 25 decreases.

The second cell 28-2 is written in a manner to output a value that is complementary to the first cell 28-1. Essentially, when the first cell 28-1 outputs a logic value of 1, the charge quantity of the floating gate 25 is increased, and the second cell 28-2 decreases the charge quantity of the floating gate 25 and outputs a logic value of 0. Furthermore, when the first cell 28-1 outputs a logic value of 0, the charge quantity of the floating gate 25 is decreased, and the second cell 28-2 increases the charge quantity of the floating gate 25 and outputs a logic value of 1. The correction memory 20 may set the bit value to 1 when the first cell 28-1 outputs a logic value of 1 and the second cell 28-2 outputs a logic value of 0. Furthermore, the correction memory 20 may set the bit value to 0 when the first cell 28-1 outputs a logic value of 0 and the second cell 28-2 outputs a logic value of 1. Since the value of a single bit is determined from the logic values of two cells 28, it is harder for errors to occur in the bit value.

Figure 11:
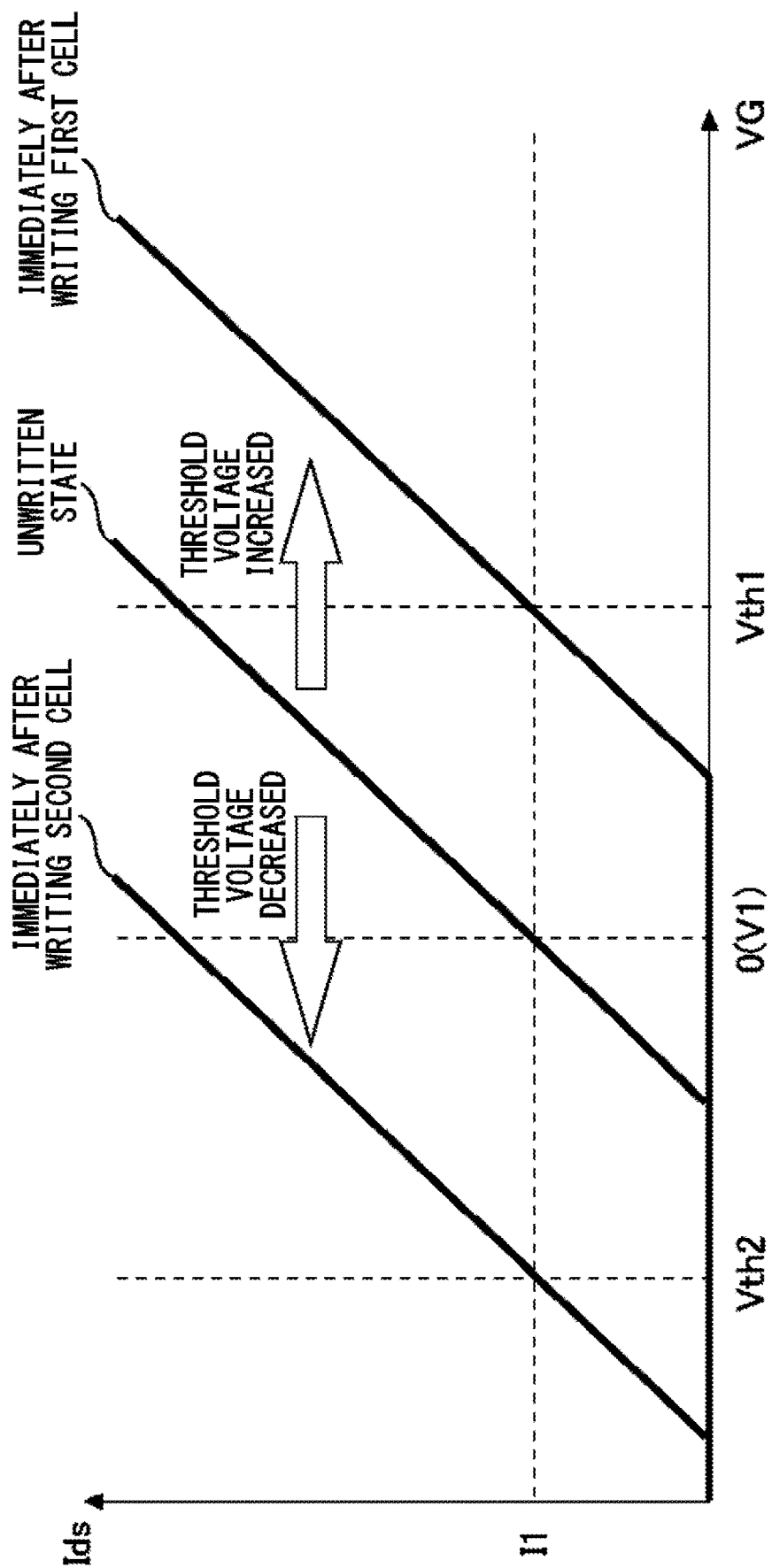
FIG. 11 shows the IV characteristics of each cell 28 in a case where a bit value of 1 is written to the first cell 28-1 and the second cell 28-2.

FIG. 11 shows the IV characteristics of each cell 28 in a case where a bit value of 1 is written to the first cell 28-1 and the second cell 28-2. Essentially, the charge is accumulated in the floating gate 25 of the first cell 28-1 such that this charge quantity becomes greater than or equal to a prescribed quantity. On the other hand, charge is extracted from the floating gate 25 of the second cell 28-2 such that this charge quantity becomes less than or equal to a prescribed quantity. In the present example, the gate voltage V1 is 0 V during the normal time. Furthermore, the threshold current is I1.

As described above, when charge is accumulated in the floating gate 25 of the first cell 28-1, the threshold voltage Vth1 of the first cell 28-1 increases. Furthermore, when charge is extracted from the floating gate 25 of the second cell 28-2, the threshold voltage Vth2 of the second cell 28-2 is decreased.

Figure 12:
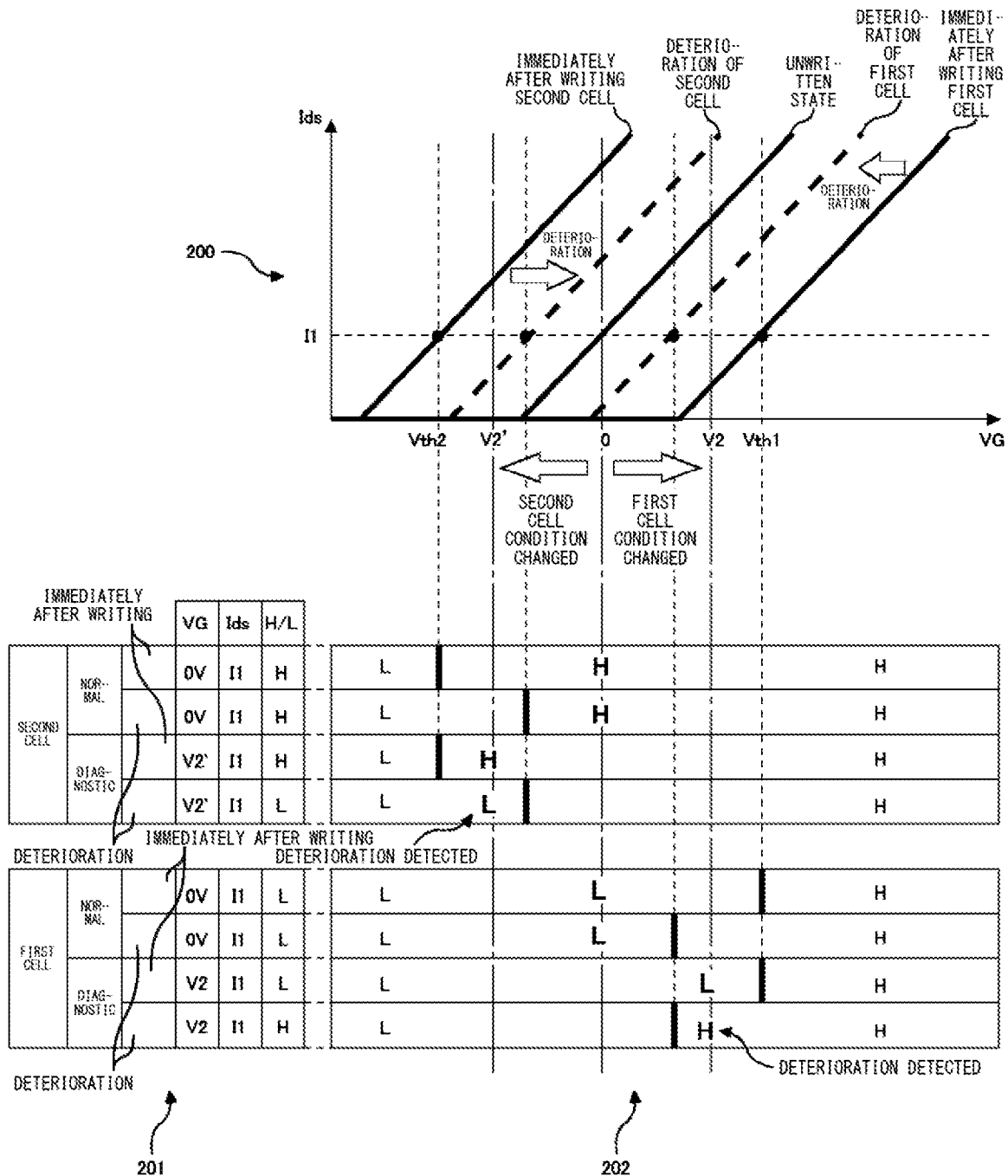
FIG. 12 is a diagram for describing an example of an operation of the sensor apparatus 100 that includes a twin cell.

FIG. 12 is a diagram for describing an example of an operation of the sensor apparatus 100 that includes a twin cell. In FIG. 12, the graph 200 in the top portion shows the IV characteristics of each cell 28 in a case where the first cell 28-1 and the second cell 28-2 have deteriorated. In FIG. 12, the table 201 in the bottom portion shows the reading conditions for the correction data during the normal time and during the diagnostic time, for each state of each cell 28. The state of each cell 28 indicates a state immediately after writing or a deterioration state. Furthermore, the table 201 shows the logic values H/L read in each state of each cell 28.

In the present example, the gate voltages V1 of the first cell 28-1 and the second cell 28-2 are 0 V during the normal time. Furthermore, during the diagnostic time, the gate voltage V2 is applied to the first cell 28-1 and a gate voltage V2' is applied to the second cell 28-2. Furthermore, in both cases, the threshold current is I1.

In FIG. 12, the chart 202 in the bottom portion shows a range of the gate voltage VG for which a logic value of L is output and a range of the gate voltage VG for which a logic value of H is output, by the cells 28 in each state shown in the table 201. The horizontal axes in the chart 202 correspond to the horizontal axis (gate voltage VG) in the graph 200. In the chart 202, the boundaries between the range of the gate voltage VG for which a logic value of L is output and the range of the gate voltage VG for which a logic value of H is output are displayed as thick solid lines. Each boundary corresponds to a gate voltage VG at which the IV characteristic curve in each state intersects with the threshold current I1. In the chart 202, the logic values at the time when the corresponding gate voltage VG is applied to the cells 28 in each state are shown by thick characters.

When the first cell 28-1 deteriorates, the threshold voltage Vth1 of the first cell 28-1 is reduced. Therefore, by making the gate voltage V2 during the diagnostic time greater than the gate voltage V1 (0 V) during the normal time, it is possible to detect the deterioration of the first cell 28-1 during the diagnostic time before an error occurs in the reading data during the normal time. The gate voltage V2 is less than the threshold voltage Vth1 immediately after a bit value of 1 is written to the first cell 28-1. The gate voltage V2 may be less than or equal to 90%, 80%, or 70% of the threshold voltage Vth1 immediately after a bit value of 1 is written to the first cell 28-1.

When the second cell 28-2 deteriorates, the threshold voltage Vth2 of the second cell 28-2 is reduced. Therefore, by making the gate voltage V2' during the diagnostic time less than the gate voltage V1 (0 V) during the normal time, it is possible to detect the deterioration of the second cell 28-2 during the diagnostic time before an error occurs in the reading data during the normal time. The gate voltage V2' is greater than the threshold voltage Vth2 immediately after a bit value of 1 is written to the second cell 28-2. The gate voltage V2' may be greater than or equal to 110%, 120%, or 130% of the threshold voltage Vth2 immediately after a bit value of 1 is written to the second cell 28-2.

Figure 13:
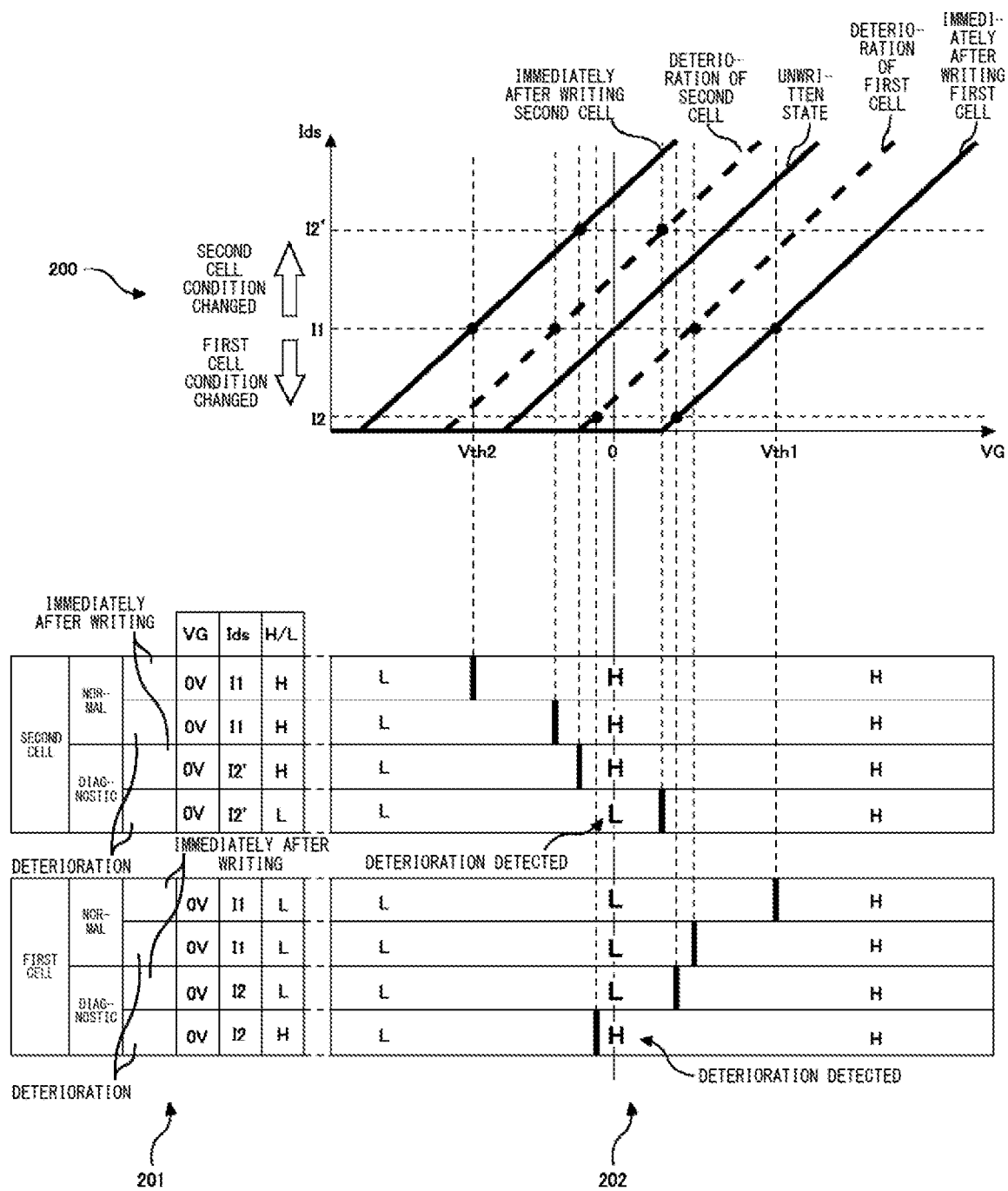
FIG. 13 is a diagram for describing an example of another operation of the sensor apparatus 100 that includes a twin cell.

FIG. 13 is a diagram for describing an example of another operation of the sensor apparatus 100 that includes a twin cell. The sensor apparatus 100 of the present example changes the threshold current of each cell 28, between the normal time and the diagnostic time. Furthermore, the gate voltage applied to each cell 28 is V1 (0 V) during both the normal time and the diagnostic time. The rest of the operation is the same as in the example of FIG. 12.

In the present example, the threshold current of the first cell 28-1 and the second cell 28-2 is I1 during the normal time. Furthermore, during the diagnostic time, the threshold current of the first cell 28-1 is I2 and the threshold current of the second cell 28-2 is I2'.

When the first cell 28-1 deteriorates, the threshold voltage Vth1 of the first cell 28-1 is reduced. Therefore, by making the threshold current I2 during the diagnostic time smaller than the threshold current I1 during the normal time, it is possible to detect deterioration of the first cell 28-1 during the diagnostic time, before an error occurs in the reading data during the normal time.

When the second cell 28-2 deteriorates, the threshold voltage Vth2 of the second cell 28-2 is increased. Therefore, by making the threshold current I2' during the diagnostic time larger than the threshold current I1 during the normal time, it is possible to detect deterioration of the second cell 28-2 during the diagnostic time, before an error occurs in the reading data during the normal time.

In the case of a twin cell, the control section 10 controls the reading conditions independently for each cell 28. Therefore, it is possible to set reading conditions that are suitable for each cell 28, and accurately detect the deterioration.

In the case of a twin cell as well, the examples shown in FIGS. 12 and 13 may be combined. In other words, the gate voltage V2 and the threshold current I2 may be set for the first cell 28-1 during the diagnostic time. Furthermore, the gate voltage V2' and the threshold current I2' may be set for the second cell 28-2 during the diagnostic time. In this way, the deterioration of the cells 28 can be detected earlier.

Furthermore, in a case where the correction memory 20 includes a plurality of twin cells, the diagnosing section 40 may perform a step to diagnose the plurality of first cells 28-1 and a step to diagnose the plurality of second cells 28-2. The diagnosing section 40 may detect whether any one of the first cells 28-1 has deteriorated, using the logical product or the logical sum of the outputs of the plurality of first cells 28-1. The diagnosing section 40 may detect whether any one of the second cells 28-2 has deteriorated, using the logical product or the logical sum of the outputs of the plurality of second cells 28-2. By performing the diagnosis collectively for the same types of cells 28, the correction memory 20 can be diagnosed efficiently.

The diagnosing section 40 may diagnose deterioration of the correction memory 20 every time the sensor apparatus 100 is activated. The diagnosing section 40 may diagnose the deterioration of the correction memory 20 every time an external apparatus that uses the data output of the sensor apparatus 100 is activated. The diagnosing section 40 may diagnose the deterioration of the correction memory 20 at prescribed periods.

Figure 14:
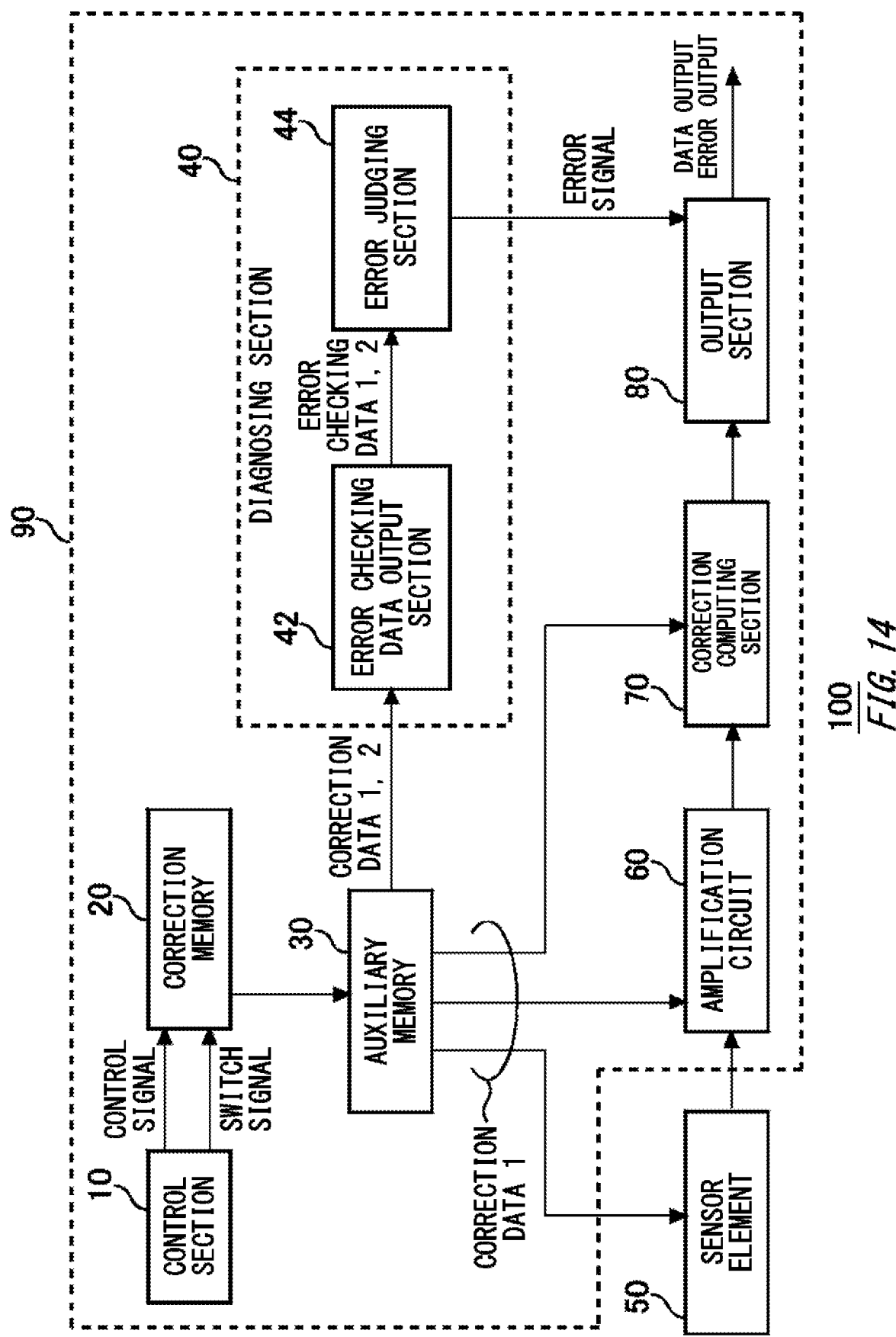
FIG. 14 shows an example of another operation of the sensor apparatus 100.

FIG. 14 shows an example of another operation of the sensor apparatus 100. The sensor apparatus 100 of the present example differs from the sensor apparatus 100 shown in FIG. 1 with regard to the operation of the diagnosing section 40. The rest of the operations are the same as those of the sensor apparatuses 100 shown in FIGS. 1 to 13.

The diagnosing section 40 shown in FIG. 1 reads the reference data stored by the correction memory 20. The diagnosing section 40 of the present example receives, as the reference data, the correction data 1 read from the correction memory 20 according to a first reading condition during the normal time. The diagnosing section 40 detects deterioration of the correction memory 20 by making a comparison between the correction data 1 read according to the first reading conditions during the normal time and the correction data 2 read according to the second reading conditions during the diagnostic time.

In the present example, the error checking data output section 42 generates the error checking data 1 for the correction data 1, and generates the error checking data 2 for the correction data 2. As described above, the error checking data is data obtained by performing a predetermined computation on the correction data. The error judging section 44 judges whether the correction memory 20 has deteriorated by comparing the two pieces of error checking data. Through such an operation as well, it is possible to diagnose deterioration of the correction memory 20 before an error occurs in the correction data 1 during the normal time.

Figure 15:
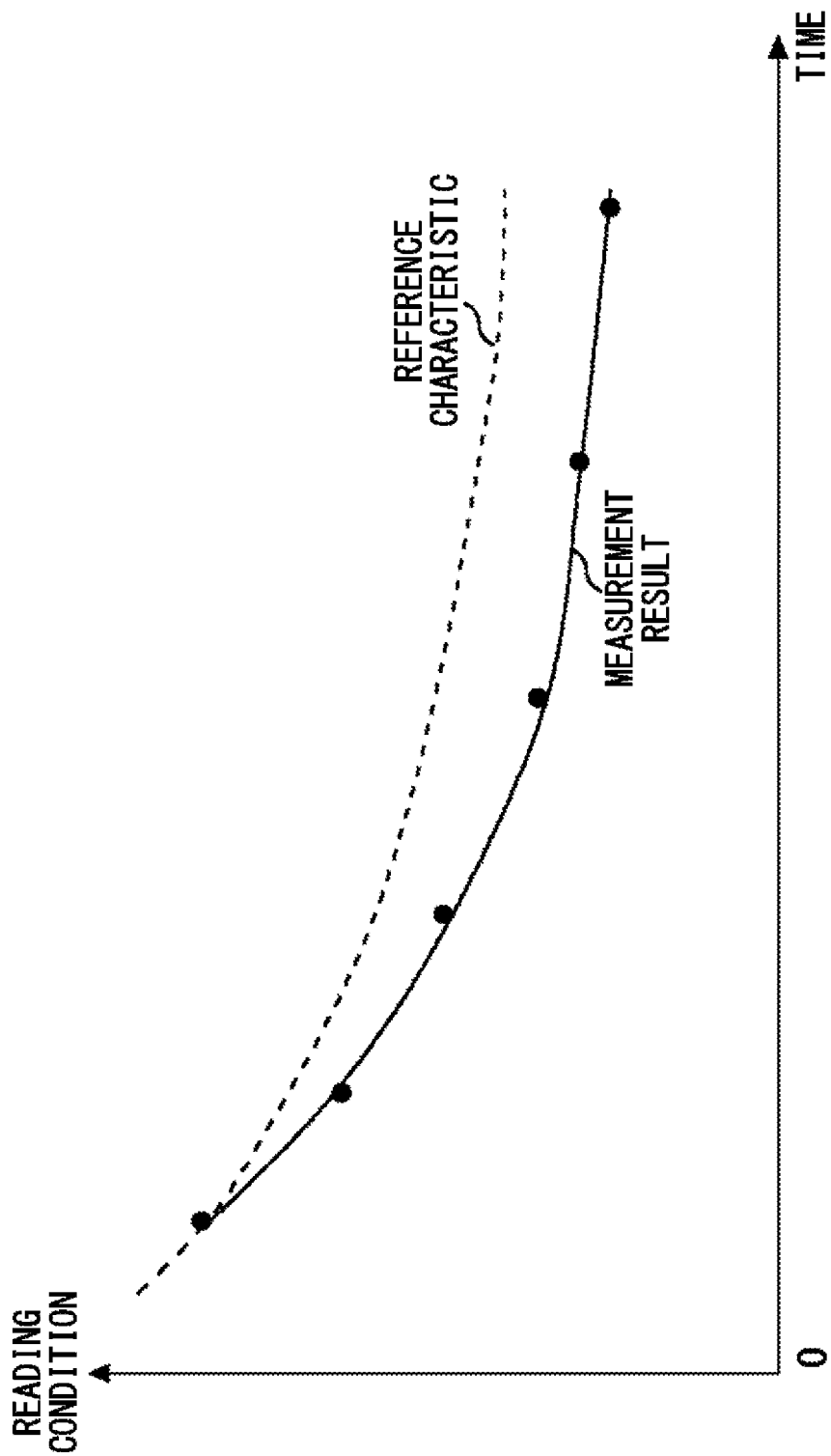
FIG. 15 shows an example of another operation of the sensor apparatus 100.

FIG. 15 shows an example of another operation of the sensor apparatus 100.

The sensor apparatus 100 of the present example changes the reading conditions used during the diagnostic time, and measures a boundary value of the reading conditions at which an error occurs in the correction data 2. The sensor apparatus 100 diagnoses the correction memory 20 based on the change over time of the measured boundary value of the reading conditions.

For example, the diagnosing section 40 may estimate a time at which an error will occur in the correction data 1 during the normal time, based on the slope of the change over time (i.e. the rate of deterioration). The diagnosing section 40 may generate an error output when the difference between this estimated time and the current time is less than or equal to a reference value.

Furthermore, the diagnosing section 40 may diagnose the correction memory 20 by making a comparison between the waveform of the change over time and a preset reference characteristic. The diagnosing section 40 may generate the error output when the measured boundary value of the reading condition drops below a reference characteristic.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

LIST OF REFERENCE NUMERALS

10: control section, 20: correction memory, 21: current source, 22: switching element, 23: semiconductor substrate, 24: control gate, 25: floating gate, 26: drain region, 27: source region, 28: cell, 28-1: first cell, 28-2: second cell, 30: auxiliary memory, 31: reference voltage source, 32: selecting section, 34: selecting section, 40: diagnosing section, 42: error checking data output section, 44: error judging section, 50: sensor element, 60: amplification circuit, 70: correction calculating section, 80: output section, 90: semiconductor device, 100: sensor apparatus, 200: graph, 201: table, 202: chart

What is claimed is:

1. A semiconductor device comprising:
a correction memory that stores therein correction data for correcting a correction target;
a correcting section that corrects the correction target, using the correction data read from the correction memory;
a diagnosing section that diagnoses the correction memory, using the correction data read from the correction memory; and
a control section that controls reading conditions used when reading the correction data from the correction memory, wherein
the control section causes a first reading condition, used when reading the correction data for correcting the correction target, to differ from a second reading condition, which is used when reading the correction data for the diagnosis, and
the reading conditions are conditions that cause a change in how easily an error occurs in the correction data read from the correction memory.

2. The semiconductor device according to claim 1, wherein
the diagnosing section diagnoses the correction memory by comparing the correction data read by the second reading condition to reference data.

3. The semiconductor device according to claim 2, wherein
the reference data is the correction data read by the first reading condition.

4. The semiconductor device according to claim 1, wherein
the control section sets the second reading condition to cause an error to occur more easily in the read correction data, compared to the first reading condition.

5. The semiconductor device according to claim 1, wherein
the diagnosing section detects the reading condition that causes an error in the correction data, and diagnoses the correction memory based on change over time of the detected reading condition.

6. A sensor apparatus comprising:
the semiconductor device according to claim 1; and
a sensor element, wherein the correction target is a detection value of the sensor element.

7. A semiconductor device comprising:
a correction memory that stores therein correction data for correcting a correction target;
a correcting section that corrects the correction target, using the correction data read from the correction memory;
a diagnosing section that diagnoses the correction memory, using the correction data read from the correction memory; and
a control section that controls reading conditions used when reading the correction data from the correction memory, wherein
the control section causes a first reading condition, used when reading the correction data for correcting the correction target, to differ from a second reading condition, which is used when reading the correction data for the diagnosis, and
the correction memory includes:
a control gate to which a gate voltage is applied;
an output terminal having an output value that changes according to whether or not the gate voltage applied to the control gate is greater than or equal to a threshold voltage; and
a floating gate that accumulates charge corresponding to a value of the correction data, and changes the threshold voltage according to the accumulated charge, and
the control section changes the gate voltage applied to the control gate for reading the correction data, between the first reading condition and the second reading condition.

8. The semiconductor device according to claim 7, wherein
the correction memory includes a first cell in which the threshold voltage increases when the charge accumulated in the floating gate increases, and
the diagnosing section sets a gate voltage applied to the first cell under the second reading condition to be a higher voltage than a gate voltage applied to the first cell under the first reading condition.

9. The semiconductor device according to claim 7, wherein
the correction memory includes a plurality of twin cells, which each includes a first cell in which the threshold voltage increases when the charge accumulated in the floating gate increases, and a second cell in which the threshold voltage decreases when the charge accumulated in the floating gate increases, and
the diagnosing section diagnoses a plurality of the first cells by reading the correction data from a plurality of the first cells, and diagnoses a plurality of the second cells by reading the correction data from a plurality of the second cells.

10. A semiconductor device comprising:
a correction memory that stores therein correction data for correcting a correction target;
a correcting section that corrects the correction target, using the correction data read from the correction memory;
a diagnosing section that diagnoses the correction memory, using the correction data read from the correction memory; and a control section that controls reading conditions used
when reading the correction data from the correction
memory, wherein
the control section causes a first reading condition, used
when reading the correction data for correcting the
correction target, to differ from a second reading
condition, which is used when reading the correction
data for the diagnosis, and
the correction memory includes:
a control gate to which a gate voltage is applied;
an output terminal having an output value that
changes according to whether or not the gate
voltage applied to the control gate is greater than
or equal to a threshold voltage;
a floating gate that accumulates charge corresponding to a value of the correction data, and changes
the threshold voltage according to the accumulated charge; and
a current source that is connected to the output
terminal and defines a threshold current, and
the control section changes the threshold current, between
the first reading condition and the second reading
condition.

11. The semiconductor device according to claim 10,
wherein
the correction memory includes a first cell in which the
threshold voltage increases when the charge accumulated in the floating gate increases, and
the diagnosing section sets a threshold current of the first
cell under the second reading condition to be a smaller
current than a threshold current of the first cell under
the first reading condition.

\* \* \* \* \*